United States Patent [19]

Possin

[11] Patent Number: 5,610,404
[45] Date of Patent: Mar. 11, 1997

[54] FLAT PANEL IMAGING DEVICE WITH GROUND PLANE ELECTRODE

[75] Inventor: George E. Possin, Niskayuna, N.Y.

[73] Assignee: General Electric Company, Schenectady, N.Y.

[21] Appl. No.: 523,324

[22] Filed: Sep. 5, 1995

[51] Int. Cl.$^6$ .......................... H01L 31/0224; G01T 1/24
[52] U.S. Cl. ................................ 250/370.09; 250/370.08; 250/208.1
[58] Field of Search ........................... 250/208.1, 370.08, 250/370.09; 257/446, 448

[56]  References Cited

U.S. PATENT DOCUMENTS

| 5,313,319 | 5/1994 | Salisbury. | |
|---|---|---|---|
| 5,389,775 | 2/1995 | Kwasnick et al.. | |

FOREIGN PATENT DOCUMENTS

| 58-17784 | 2/1983 | Japan | 257/448 |
|---|---|---|---|
| 61-32571 | 2/1986 | Japan | 257/448 |

OTHER PUBLICATIONS

Application entitled, "Solid State Radiation Imager With Gate Electrode Plane Shield Wires," Ser. No. 08/523,323, filed Sep. 5, 1995.

Application entitled, "Solid State Fluoroscopic Radiation Imager With Thin Film Transistor Addressable Array," Ser. No. 08/174,921, Dec. 29, 1993.

*Primary Examiner*—Edward J. Glick
*Attorney, Agent, or Firm*—Donald S. Ingraham

[57]  ABSTRACT

A flat panel radiation imaging device that exhibits reduced capacitive coupling between pixel photodiodes and readout data lines, and thus in operation has reduced phantom images and image artifacts, includes a ground plane electrode that is disposed between the substrate and the plurality of pixels arranged in an imaging array pattern. The ground plane electrode is a conductive material layer that is disposed in a continuous sheet underlying the imaging array pattern; alternatively, the ground plane is a patterned sheet of conductive material having data line cutout areas disposed so that no ground plane conductive material underlies or is closer than a lateral set off distance from data lines in the imaging array pattern. A patterned ground plane further may include pixel electrode cutout sections disposed such that ground plane conductive material underlies pixel electrodes in the imaging array pattern only by a selected overlap distance around the boundaries of the pixel electrode.

10 Claims, 3 Drawing Sheets

FLAT PANEL IMAGING DEVICE WITH GROUND PLANE ELECTRODE

BACKGROUND OF THE INVENTION

This invention relates generally to solid state radiation imagers and in particular to structures in such imagers to reduce phantom noise and image artifacts.

Solid state radiation imagers typically comprise a large flat panel imaging device having a plurality of pixels arranged in rows and columns. Each pixel includes a photosensor, such as a photodiode, that is coupled via a switching transistor to two separate address lines, a scan line and a data line. In each row of pixels, each respective switching transistor (typically a thin film field effect transistor (FET)) is coupled to a common scan line through that transistor's gate electrode. In each column of pixels, the readout electrode of the transistor (e.g., the source electrode of the FET) is coupled to a data line, which in turn is selectively coupled to a readout amplifier. Devices such as described herein are commonly referred to as flat panel imagers.

During nominal operation, radiation (such as an x-ray flux) is pulsed on and the x-rays passing through the subject being examined are incident on the imaging array. The radiation is incident on a scintillator material and the pixel photosensors measure (by way of change in the charge across the diode) the amount of light generated by x-ray interaction with the scintillator. Alternatively, the x-rays can directly generate electron-hole pairs in the photosensor (commonly called "direct detection"). The photosensor charge data are read out by sequentially enabling rows of pixels (by applying a signal to the scan line causing the switching transistors coupled to that scan line to become conductive), and reading the signal from the respective pixels thus enabled via respective data lines (the photodiode charge signal being coupled to the data line through the conductive switching transistor and associated readout electrode coupled to a data line). In this way a given pixel can be addressed though a combination of enabling a scan line coupled to the pixel and reading out at the data line coupled to the pixel.

The performance of flat panel imaging devices is degraded by capacitive coupling between data lines and the pixel photodiode electrodes. In particular, during some common imager operations the x-ray flux remains on during readout of the pixels. One example of such operations is fluoroscopy in small or less sophisticated units as might be used in surgery or portable applications; such units use light weight and low cost x-ray generators which must be on continuously to produce an adequate output signal. Such units further typically are not adapted to rapidly cycle the x-ray beam on and off during relevant periods to prevent radiating during the readout periods. Another example are imagers used in conjunction with radiation therapy in which the radiation source is on continuously (to maximize delivered dose) or is pulsed on periodically, which pulses can occur during the readout period. This simultaneous excitation of the imager while reading out pixels results in image artifacts or "phantom" images. The phantom images occur as a result of capacitive coupling between the respective photodiode electrodes and adjacent data lines; during the readout of a given pixel attached to a given data line, the potential of the other pixel electrodes (e.g., the non-read pixels) continue to change as the radiation flux strikes the imager. The change in potential of the pixels not being read out is capacitively coupled into the data line, thereby inducing an additional charge which is read out by the amplifier and presented as part of the signal from the addressed pixel. This effect produces cross-talk or contrast degradation in the image, and is commonly evidenced as bright lines in the display readout.

It is desirable that a solid state imager array exhibit minimal cross-talk and be capable of generating a stable and accurate image in multiple modes of operation, including modes in which pixels are being read out while the x-ray flux is being applied.

SUMMARY OF THE INVENTION

A flat panel radiation imaging device that exhibits reduced capacitive coupling between pixel photodiode electrodes and readout data lines, and thus exhibits reduced phantom images and image artifacts in operation, includes a ground plane electrode that is disposed between the substrate and the plurality of pixels arranged in an imaging array pattern. The ground plane electrode comprises a conductive material that is disposed in a continuous sheet underlying the imaging array pattern; alternatively, the ground plane comprises a patterned sheet of conductive material having data line cutout areas disposed so that ground plane conductive material does not underlie (or is closer than a lateral set off distance) from the data line for at least a portion of the length of the data line in the imaging array pattern. A patterned ground plane further may comprise pixel electrode cutout sections disposed such that ground plane conductive material underlies pixel electrodes in the imaging array pattern only by a selected overlap distance around the boundaries of the pixel electrode.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description in conjunction with the accompanying drawings in which like characters represent like parts throughout the drawings, and in which:

DETAILED DESCRIPTION OF THE INVENTION

Figure 1A:
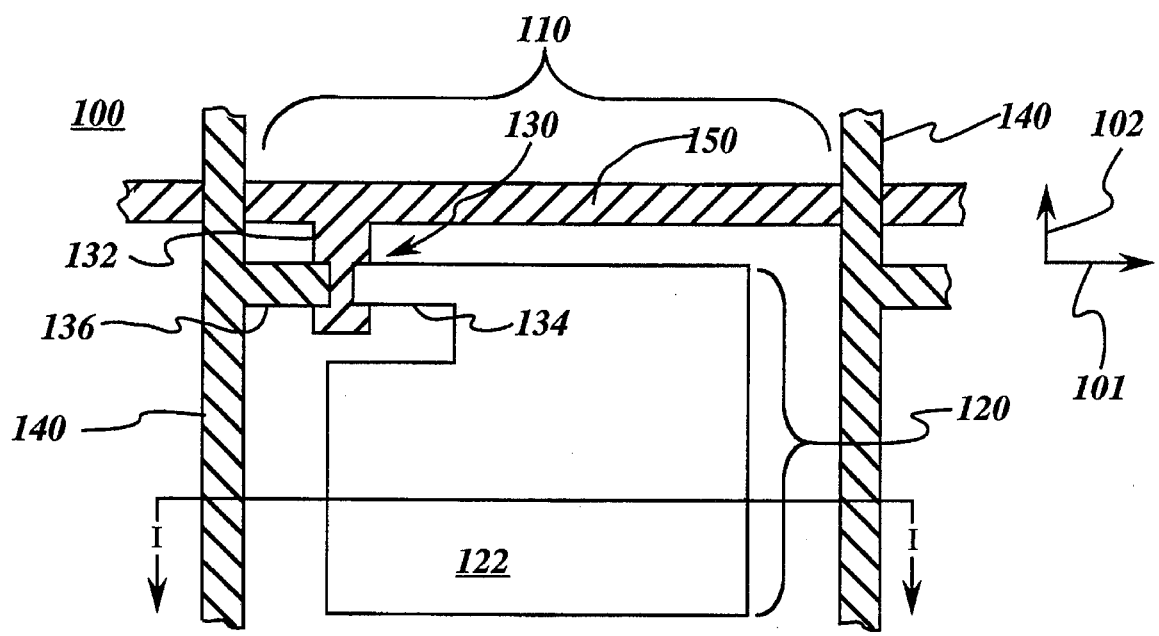
FIG. 1(A) is a plan view of a portion of an imager array in accordance with the prior art.

A solid state radiation imager 100 comprises a plurality of pixels 110 (a representative one of which is illustrated in FIG. 1(A)) that are arranged in a matrix-like imager array pattern comprising rows and columns of pixels 110. For purposes of illustration and not limitation, imager 100 has a first axis 101 that is the axis along which the rows of pixels are aligned, and a second axis 102 that is the axis along which the columns of pixels are aligned. Each pixel 110 comprises a photosensor 120 and a thin film switching transistor 130. Photosensor 120 typically comprises a photodiode having a pixel electrode 122 that corresponds with the active (that is, photosensitive) area of the device. Switching transistor 130 typically comprises a thin film field effect transistor (FET) having a gate electrode 132, a drain electrode 134 and a source electrode (or readout electrode) 136. Imager 100 further comprises a plurality of data lines 140 and scan lines 150 (collectively referred to as address lines). At least one scan line 150 is disposed along first axis 101 for each row of pixels in the imager array pattern. Each scan line is coupled to the respective gate electrodes 132 of pixels in that row of pixels. At least one data line is disposed along second axis 102 for each column of pixels in the imager array pattern, and is coupled to the respective readout electrodes 136 of pixels in that column of pixels.

Figure 1B:
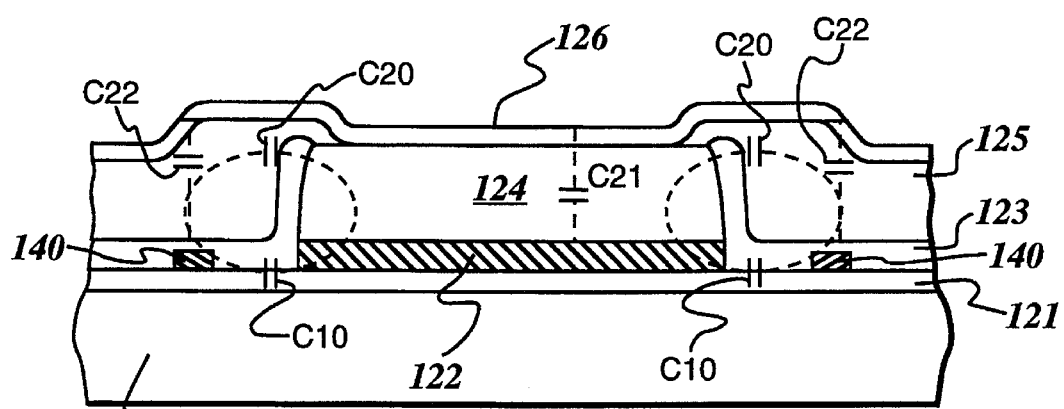
FIG. 1(B) is a partial cross-sectional view of a representative pixel taken along line I—I of FIG. 1(A).

A partial cross-sectional view of one pixel 110 is presented in FIG. 1(B). Photodiode 120 is disposed over a substrate 105. A first dielectric material layer 121 is typically disposed between pixel electrode 122 and substrate 105. Photodiode 120 further comprises a photosensitive material body 124 (typically comprising amorphous silicon) that is electrically coupled to a common electrode 126 that is disposed over the imager array. A second dielectric material layer 123, typically comprising silicon nitride or the like, extends over a portion of the sidewalls of the photosensitive material body 124, and a third dielectric layer 125, comprising polyimide or the like, is disposed between common electrode 126 and other components in the imager array (except for the contact point to photosensitive material body 124 through a via in second dielectric material layer 123 and third dielectric layer 125).

In an imager array as illustrated in FIG. 1(B), there are several sources of capacitive coupling between conductive components in the array. For example, there is capacitive coupling between each data line 140 and adjacent pixel electrodes 122. As used herein, "adjacent" conductive components refers to components that are spatially near one another but not in direct physical contact so that no direct conductive path (or short circuit) exists between the two components. For analysis purposes, the coupling between a data line and an adjacent photodiode base electrode is broken down into a first capacitance $C_{10}$ (the representation in phantom in FIG. 1(B) is for illustrative purposes and does not represent a separate capacitor component in the array) that predominantly represents coupling though the substrate and materials disposed under the pixel electrode 122 (as used herein, "under", "over", "above" and the like are used to refer to the relative position of a component with respect to the substrate, and does not in any way connote any limitation on the orientation, use, or operation of the imager array). A second capacitance $C_{20}$ denotes capacitive coupling through component above base electrode 122. It has been observed that the "lower" path capacitance, $C_{10}$, frequently is a larger contributor to induced capacitance than the "upper" path capacitance, $C_{20}$. Other sources of capacitive coupling are between pixel electrode 122 and common electrode 126 (denoted as $C_{21}$ in FIG. 1(B)) and between data line 140 and common electrode 126 (denoted as $C_{22}$ in FIG. 1(B)). The total pixel capacitance (exclusive of typically small parasitic capacitance to scan lines) is expressed as:

$$C_{pixel} = 2(C_{10} + C_{20}) + C_{21}$$

$C_{pixel}$ is dominated by $C_{21}$ (base electrode to common electrode) because the pixel electrode area is much larger than the data line area. The total pixel capacitance is a function of the induced capacitance to data lines on either side of the pixel, hence factor of two with respect to the sum of $C_{10}$ and $C_{20}$.

The capacitive coupling effect is most often of concern in operations in which the imager is excited (that is, the radiation of interest (e.g., x-rays) are incident on the imager) during all or a portion of the time the pixels are being read out. The signal read out during the period of time that the imager is excited will be larger than when the readout values when the imager is not being excited. One approximation of the increase normalized to average signal can be expressed as:

$$2\left[\left(\frac{C_{10}+C_{20}}{C_{pixel}}\right)\right] \times \left[\frac{\text{\# pixels per readout channel}}{\substack{\text{\# of scan lines with pixels} \\ \text{exposed to radiation beam}}}\right] \times \left[\frac{\text{integration time}}{\text{line scan time}}\right]$$

The expression (C10+C20) represents the coupling capacitance between a single pixel electrode and one adjacent data line; in the array layout, each data line 140 is typically adjacent to two pixel electrodes 140. The ratio of the amplifier integration time to line scan time is relatively small, about 0.85. In continuous fluoroscopy, or in pulsed fluoroscopy if the beam on time is a significant fraction of interframe time, the size of the coupling effect is $2[(C_{10}+C_{20})/C_{pixel}]$, which ratio provide a useful way to characterize the magnitude of the capacitive coupling effect. For imagers having the construction described above with respect to FIGS. 1(A) and 1(B), the value of $2[(C_{10}+C_{20})/C_{pixel}]$ calculated from the structure or inferred from imager data is in the range of about 0.5%. This value is significant because typical contrast modulation in x-ray imagers is in the range between about 0.1% and about 10%.

In accordance with this invention, radiation imager 100 as described above further comprises a ground plane electrode 170 (FIG. 2) that is disposed so as to reduce the capacitive coupling between pixel electrodes 122 and adjacent data lines 140. Ground plane electrode 170 is disposed over substrate 105 such that it is between substrate 105 and the pixels and associated address lines forming the imaging array pattern. Ground plane electrode 170 is electrically coupled to a ground plane electrode voltage source 190 such that the ground plane electrode can be maintained at a desired constant electrical potential during operation of the imaging array. The structure of the present invention with the ground plane electrode provides a shielding effect between the respective pixel electrodes 122 and the data lines 140 so that the induced capacitance between these components is reduced, and in particular, induced capacitance value $C_{10}$ (the "lower" path capacitance as illustrated in FIG. 1(B)) is reduced by the positioning of the ground plane electrode beneath the pixel electrode. Another approach to reduction of induced capacitance with the use of shielding wires is presented in copending application Ser. No. 08/523,323 which is assigned to the assignee of the present invention, and incorporated herein by reference.

Ground plane electrode 170 is typically deposited on the surface of substrate 105 and has a thickness in the range between about 0.1 µm and 1 µm. Following deposition (and patterning as discussed below) of the conductive material, a ground plane dielectric layer 175 comprising silicon nitride, silicon oxide, or the like, is deposited over the conductive material to a thickness in the range between about 0.1 µm and 4 µm. In the imager fabrication process, typically the conductive material to form scan lines 150 and switching transistor gate electrodes is next deposited and patterned; thereafter the fabrication process is similar to that for fabrication of the device as appears in FIG. 1(A) and 1(B).

Figure 2:
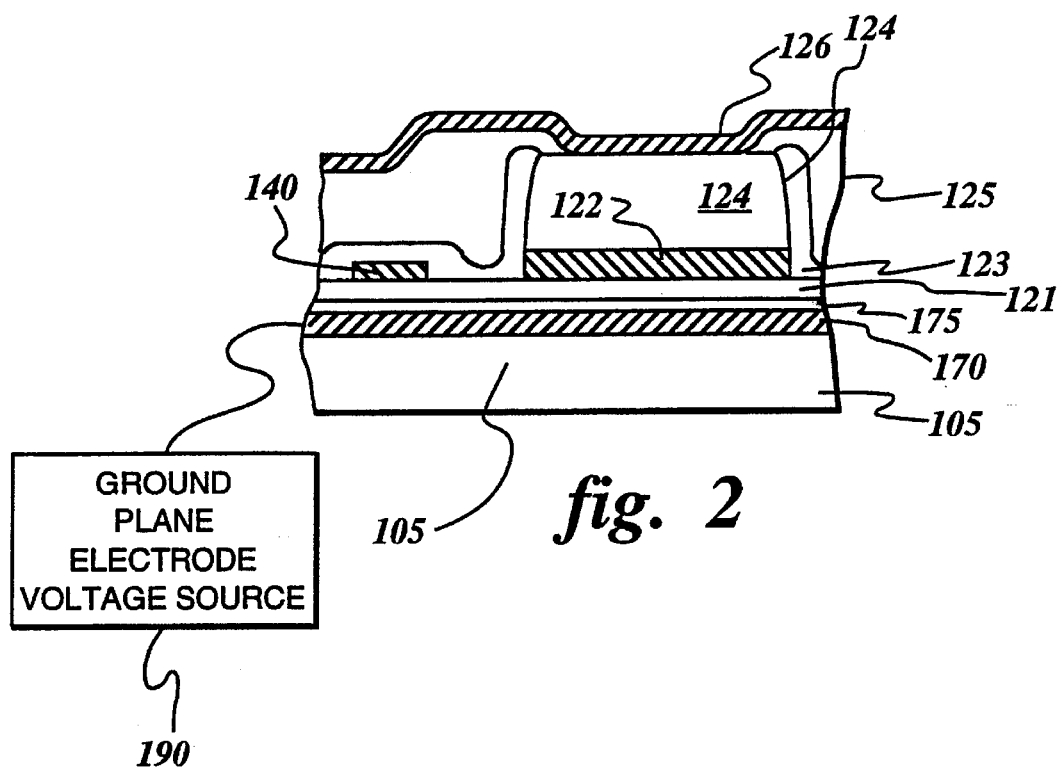
FIG. 2 is a partial cross-sectional view and partial block diagram of a representative portion of the imaging array pattern in accordance with one embodiment of the present invention.

In one embodiment of the present invention as illustrated in FIG. 2, ground plane electrode 170 comprises a continuous sheet of conductive material (e.g., molybdenum, chromium, titanium, indium tin oxide and the like) that is disposed to underlie the pixels and address lines in the imaging array pattern. The sheet of conductive material is continuous, that is, it extends under the imaging array pattern along both first axis 101 and second axis 102 (FIG. 1)A)) without cutouts (where the conductive material has been removed from the sheet) or patterning within the boundaries of the imaging array.

Figure 3:
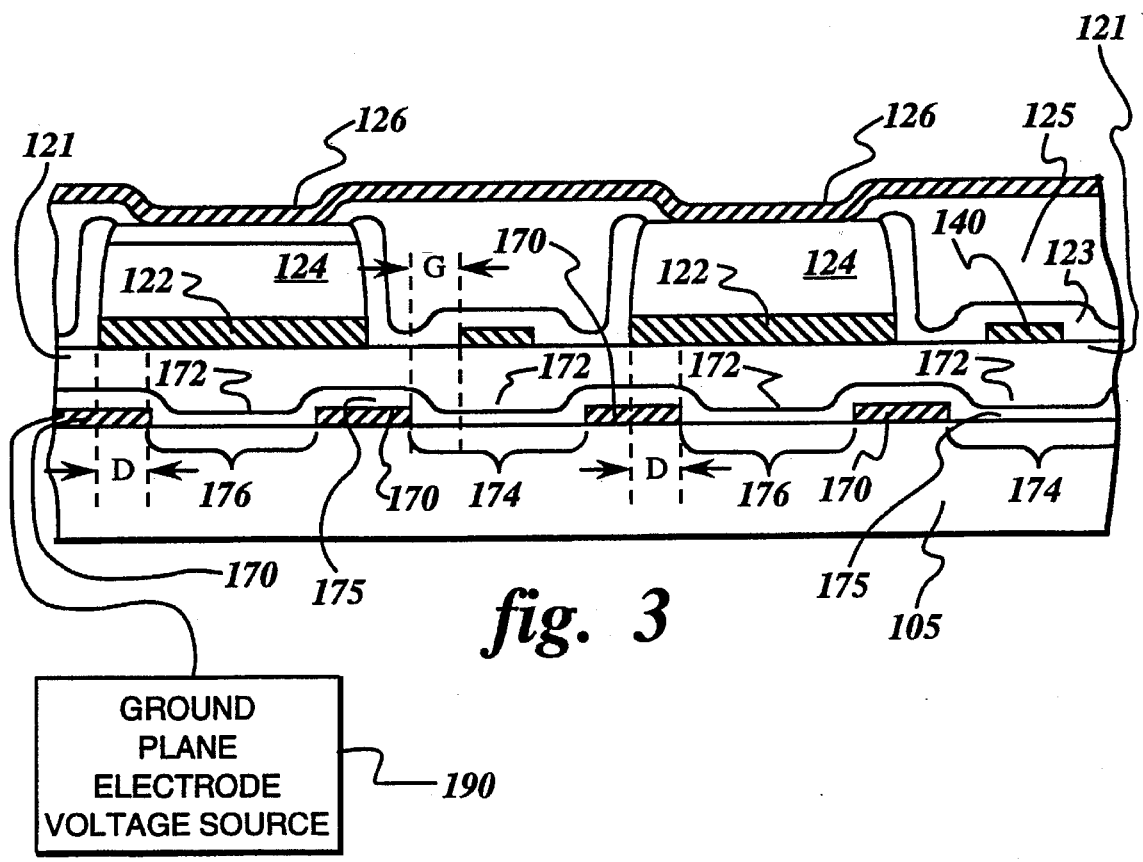
FIG. 3 is a partial cross-sectional view and partial block diagram of a representative portion of the imaging array pattern in accordance with another embodiment of the present invention.

In an alternative embodiment of the present invention as illustrated in FIG. 3, ground plane 170 is patterned, that is, the ground plane comprises cutout areas 172 in which the conductive material has been removed from selected areas of the ground plane material sheet. Patterned ground plane electrode 170 typically comprises a plurality of data line cutout regions 174 that are respectively disposed under at least a portion of the length (that is, the extent of the data line along second axis 102 of FIG. 1(A)) of respective data lines 140. Ground plane electrode 170 (FIG. 3) is patterned during the fabrication process, such as with photolithographic techniques, to provide the desired pattern of conductive material disposed on the substrate to correspond with the placement of address lines and pixels in subsequent fabrication steps. In one embodiment of the present invention, each data line cutout region is sized such that it extends along the entire length of a data line in the imaging array pattern; with this arrangement, the remaining portions of the sheet of ground plane electrode are electrically isolated from one another by the respective data line cutout regions and thus must be electrically coupled together and to ground electrode voltage source by other contact means (such as electrode shunts outside the boundaries of the imaging array pattern, not shown). Alternatively, respective data line cutout regions are disposed such that they do not extend along the entire length of data lines 140 so that a segment of ground plane electrode 170 remains in place under a portion data lines 140 to provide electrical contact between the ground plane sections separated by data line cutout regions 174.

The removal of the conductive material of ground plane electrode 170 from the region underlying data lines 140 reduces the total data line capacitance, which is a function of capacitance between the data line and pixel electrodes 122, the data line and common electrode 126, the data line and scan lines 150, and the data line and ground plane electrode 170. Removing the conductive material of ground plane electrode 170 from the region underlying the data line reduces the overall data line capacitance while maintaining the beneficial shielding effects of reducing induced capacitance between pixel electrodes and data lines.

Data line cutout regions 174 are typically further sized such that ground plane electrode 170 is laterally displaced from the boundaries of each data line 140 by a setoff gap distance "G". Gap distance G is typically in the range between about 2 μm and about 10 μm, and is selected to provide effective shielding effect for data line to pixel electrode induced capacitance while minimizing data line total capacitance, including data line to ground plane electrode capacitance.

Patterned ground plane 170 further typically comprises a plurality of pixel electrodes cutout sections 176 disposed under portions of respective pixel electrodes in the imaging array pattern. As noted above, ground plane electrode is patterned during the fabrication process to remove a portion of the conductive material sheet from the region of substrate 105 over which pixel electrodes 122 will be disposed in the assembled array. The pixel electrode cutout sections are typically sized such that conductive material of ground plane electrode 170 is disposed so that it underlies respective pixel electrodes 122 by an overlap distance "D", which distance typically is the range between about 1 μm and about 20 μm. Removal the conductive material of ground plane electrode 170 from the region underlying pixel electrodes 122 reduces the capacitance between these two electrodes and thus reduces the total capacitance seen by the pixel electrode. Removal of the conductive material further improves the yield of the fabrication process by reducing the area for potential short circuits between the ground plane and the pixel electrode.

For example, a typical thickness of ground plane dielectric layer 175 and first level dielectric layer 121 disposed between ground plane electrode 170 and pixel electrodes 122 is about 2 μm. Assuming the dielectric material is silicon oxide, which has a dielectric constant of about 3.9, and pixel electrode 122 has dimensions of about 200 μm by 200 μm, a ground plane electrode overlap distance D of about 5 μm adds between about 0.3 pf to about 3 pf additional capacitance for each pixel electrode, dependent on the thickness of the dielectric material. A typical total pixel capacitance for a 200 μm pixel is about 2 pf; for most imager applications, the increase in pixel capacitance is acceptable, especially in light of the reduced data line to pixel induced capacitance. For some applications the increase in capacitance is desirable to provide higher saturation charge loads. In this case the ground plane can be advantageously used to increase the pixel capacitance.

Figure 4:
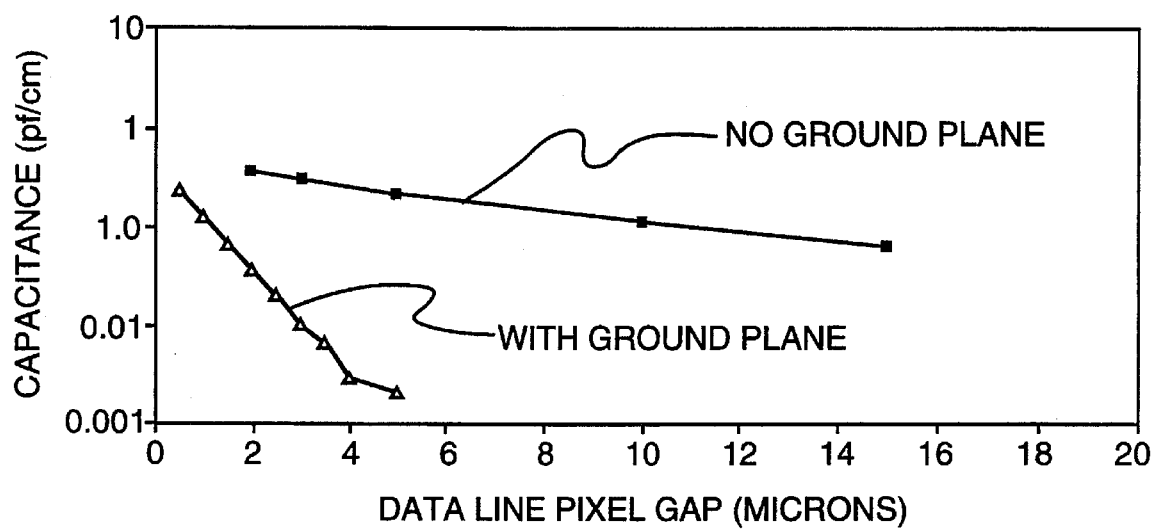
FIG. 4 is a graph of estimated single pixel to single data line capacitance model analysis results (for assumed 5 μm width data line and 1 μm dielectric separating ground plane electrode and pixel electrode) as a function of data line to pixel electrode gap for different imaging array structures.

FIG. 4 is a graphic representation of modeled results for data line to pixel capacitance as a function of data line to pixel gap, with separate curves representing a device in accordance with this invention having a continuous sheet ground plane electrode and without a ground plane electrode (all curves assume the presence of common electrode 126). As is apparent in FIG. 4, the presence of the ground plane electrode in accordance with this invention results in dramatic decreases (e.g., orders of magnitude) over a structure without the ground plane electrode.

In accordance with this invention, a flat panel radiation imaging device having a ground plane electrode exhibits enhanced performance as the structure provides reduced induced capacitance between data lines and pixel electrodes, with a consequent reduction of phantom images and image artifacts during imager operation.

It will be apparent to those skilled in the art that, while the invention has been illustrated and described herein in accordance with the patent statutes, modifications and changes may be made in the disclosed embodiments without departing from the true spirit and scope of the invention. It is, therefore, to be understood that the appended claims are intended to cover all such modifications and changes as fall within the true spirit of the invention.

What is claimed is:

1. A flat panel radiation imaging device for generating images with reduced image artifacts during read-out of the imager, the imaging device comprising:

a plurality of pixels disposed on a substrate in an imaging array pattern comprising rows and columns, each of said pixels comprising a respective photosensor coupled to a respective pixel thin film switching transistor;

a plurality of address lines disposed in said imaging array pattern so as enable individually addressing respective ones of said pixels;

a common electrode disposed over said plurality of pixels; and a ground plane electrode disposed above said substrate and beneath said plurality of pixels and said address lines, said ground plane electrode being electrically isolated from said pixels and said address lines by a ground plane dielectric layer disposed therebetween.

2. The imaging device of claim 1 wherein said plurality of address lines further comprises:

a plurality of scan lines disposed at a first level with respect to said substrate along a first axis of said imaging array pattern, each row of pixels in said imaging array pattern having a respective scan line, each of said respective scan lines being coupled to a respective gate electrode in said pixel thin film switching transistors for each pixel disposed along the respective row of pixels in said imaging array pattern; and a plurality of data lines disposed at a second level with respect to said substrate along a second axis of said imaging array pattern, each column of pixels in said imaging array pattern having a corresponding data line, each of said respective data lines being coupled to a respective readout electrode in said pixel thin film switching transistors for each pixel disposed along the respective column of pixels in said imaging array pattern.

3. The imaging device of claim 2 wherein said ground plane electrode comprises a conductive material that is disposed in a continuous sheet along said first axis and said second axis so as to underlie said imaging array pattern.

4. The imaging device of claim 2 wherein said ground plane electrode comprises a conductive material that is disposed in a patterned sheet having cutout areas disposed under portions of said imaging array pattern.

5. The imaging device of claim 4 wherein said ground plane electrode further comprises a plurality of data line cutout areas disposed such that said ground plane electrode conductive material does not underlie at least a portion of the length of said data lines disposed in said imaging array pattern.

6. The imaging device of claim 5 wherein said data line cutout areas are sized such that said ground plane electrode conductive material is disposed so as to be laterally displaced from an overlying data line along at least a portion of the length of said data line by a setoff gap distance in the range between about 2 µm and about 10 µm.

7. The imaging device of claim 4 wherein said ground plane electrode further comprises a plurality of pixel electrode cutout sections disposed under portions of respective pixel electrodes in said imaging array pattern.

8. The imaging device of claim 7 wherein each of said pixel electrode cutout sections is sized such that said ground plane electrode conductive material extends under respective pixel electrodes by an overlap distance in the range between about 1 µm and about 20 µm.

9. The imaging device of claim 1 wherein said ground plane electrode is coupled to a shield voltage source such that said ground plane electrode is maintained at a selected shield potential.

10. The imaging device of claim 1 wherein said ground plane electrode comprises a conductive material selected from the group consisting of molybdenum, titanium, indium tin oxide, and chromium, and has a thickness in the range between about 0.1 µm and about 1 µm.

* * * * *